United States Patent
Lin et al.

(10) Patent No.: US 10,276,367 B1
(45) Date of Patent: Apr. 30, 2019

(54) METHOD FOR IMPROVING WAFER SURFACE UNIFORMITY

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Jen-Chieh Lin, Kaohsiung (TW); Wen-Chin Lin, Tainan (TW); Yu-Ting Li, Chiayi (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/865,263

(22) Filed: Jan. 9, 2018

(51) Int. Cl.
*H01L 21/02* (2006.01)
*H01L 21/302* (2006.01)
*H01L 21/321* (2006.01)
*H01L 21/768* (2006.01)
*H01L 21/306* (2006.01)

(52) U.S. Cl.
CPC .. *H01L 21/02304* (2013.01); *H01L 21/02074* (2013.01); *H01L 21/02186* (2013.01); *H01L 21/302* (2013.01); *H01L 21/30625* (2013.01); *H01L 21/3212* (2013.01); *H01L 21/32115* (2013.01); *H01L 21/7684* (2013.01)

(58) Field of Classification Search
None
See application file for complete search history.

(56) References Cited

U.S. PATENT DOCUMENTS

| | | |
|---|---|---|
| 2012/0070972 A1 | 3/2012 | Chen |
| 2016/0148816 A1* | 5/2016 | Lee .................. H01L 21/30625 438/585 |
| 2017/0221723 A1* | 8/2017 | Ye ...................... H01L 21/3212 |

* cited by examiner

*Primary Examiner* — Jiong-Ping Lu
(74) *Attorney, Agent, or Firm* — Winston Hsu

(57) ABSTRACT

A method for improving wafer surface uniformity is disclosed. A wafer including a first region and a second region is provided. The first region and the second region have different pattern densities. A conductive layer is formed on the wafer. A buffer layer is then formed on the conductive layer. The buffer layer is polished until the conductive layer is exposed. A portion of the conductive layer and the remaining buffer layer are etched away.

8 Claims, 3 Drawing Sheets

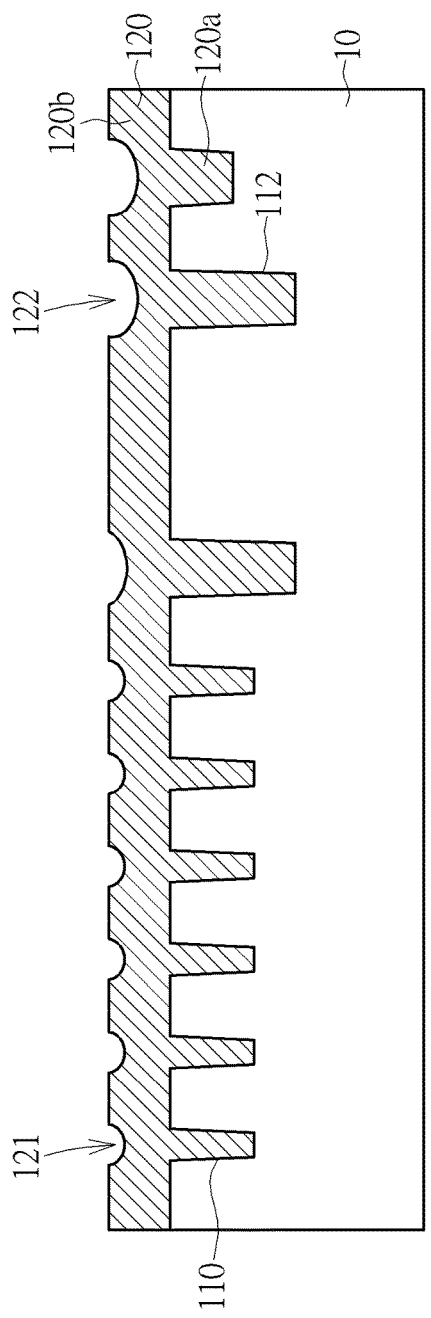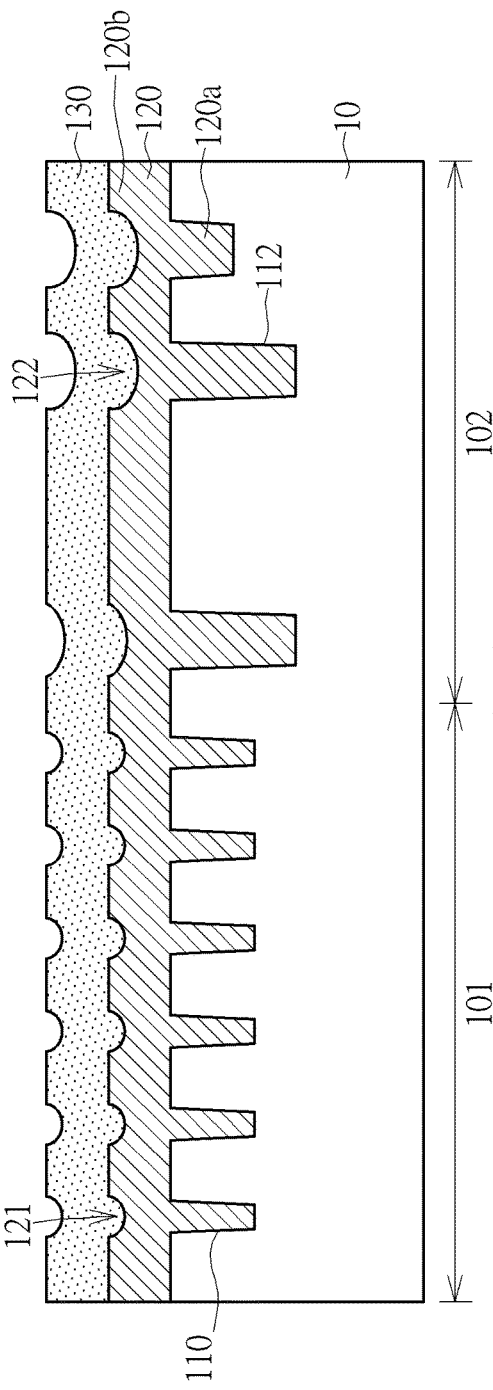

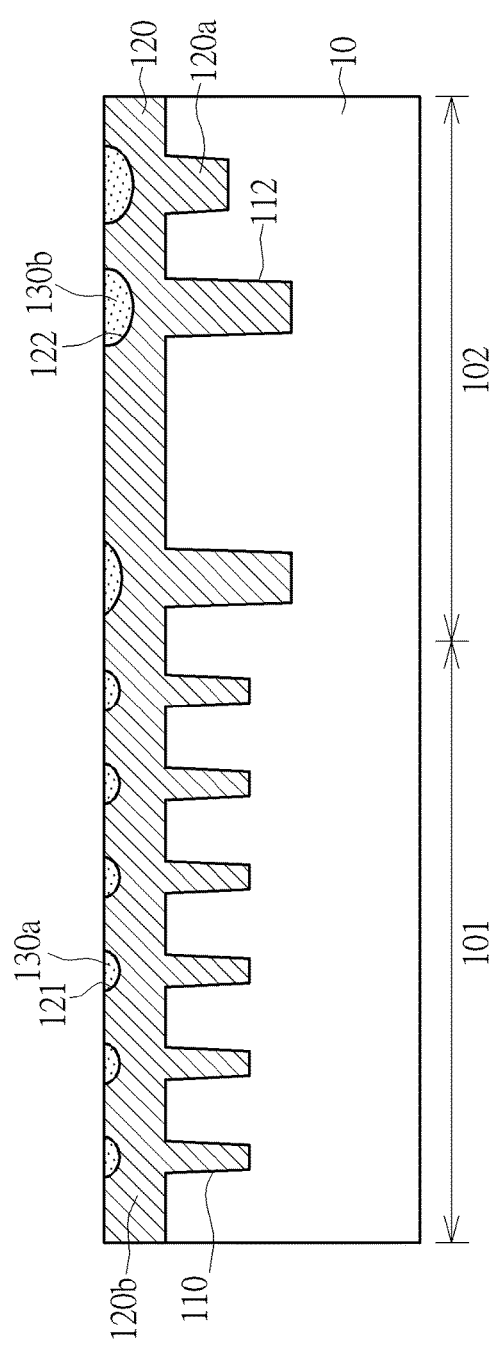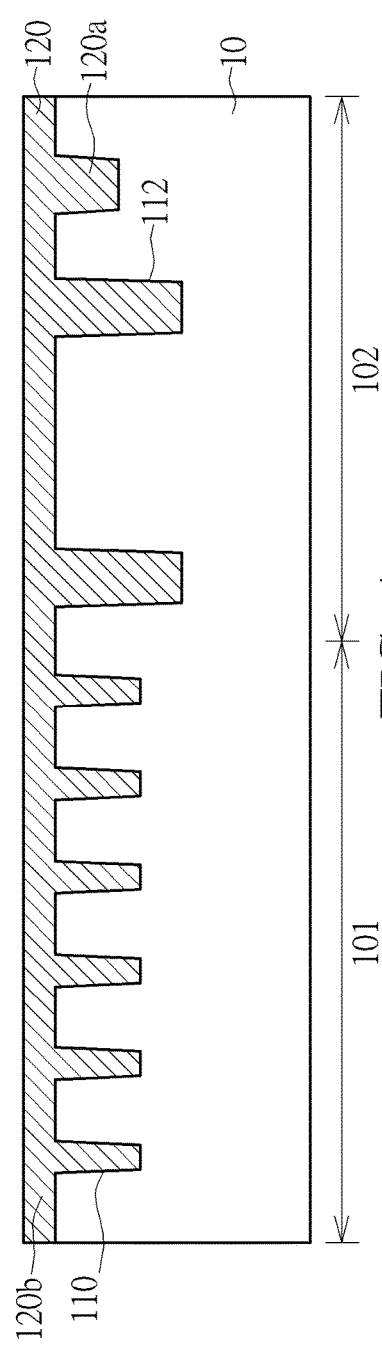

METHOD FOR IMPROVING WAFER SURFACE UNIFORMITY

BACKGROUND OF THE INVENTION

1. Field of the Invention

The present invention relates to semiconductor process technology, and more particularly to a method for improving the uniformity of a wafer surface evenness.

2. Description of the Prior Art

As semiconductor integrated circuit technology continues to improve, circuit designs on semiconductor wafers have become smaller and more complex than ever. Due to the requirements of product innovation, the number and density of functional devices in each chip area continue to increase.

A large number of semiconductor electronic components, for example, transistors, are included in the semiconductor wafer, which are interconnected through interconnection structures so as to form a complete functional circuit.

Due to the various structural patterns on the surface of the wafer, differences in the pattern density cause the material layer deposited on the wafer surface to have a problem of poor uniformity of surface evenness, thereby affecting the electrical performance of the device. Therefore, there is still a need in the art for an improved method to solve the above problem.

SUMMARY OF THE INVENTION

One object of the present invention is to provide a method for improving the uniformity of a wafer surface evenness to overcome the shortcomings and disadvantages of the prior art.

A method for improving wafer surface uniformity is disclosed. A wafer including a first region and a second region is provided. The first region and the second region have different pattern densities. A conductive layer is formed on the wafer. A buffer layer is then formed on the conductive layer. The buffer layer is polished until the conductive layer is exposed. A portion of the conductive layer and the remaining buffer layer are etched away. The remaining conductive layer is patterned to form contact pad patterns in the first region.

According to an embodiment of the present invention, the etching process has the same etching rate for the conductive layer and the remaining buffer layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 show a method for improving the uniformity of a wafer surface evenness according to an embodiment of the present invention.

DETAILED DESCRIPTION

Figure 5:
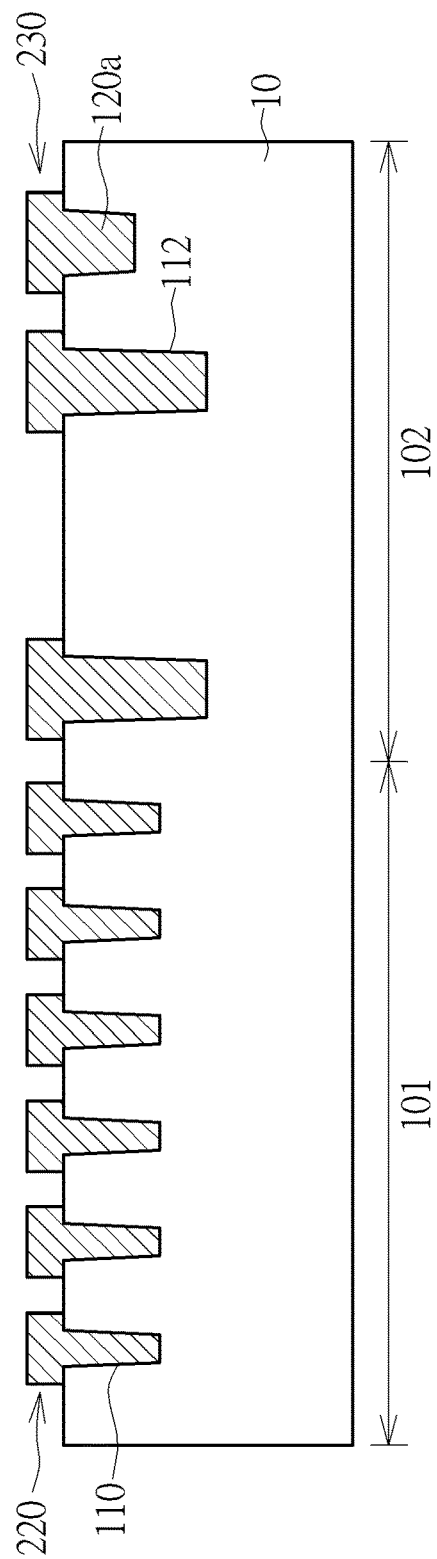

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Before further describing preferred embodiments, the specific terms used throughout the specification are described below.

The term "etch" is used herein generally to describe the process of patterning a material so that at least a portion of the material after the etch is completed can be remained. For example, a method of etching silicon typically involves patterning a photoresist layer over the silicon and then removing the silicon from areas that are not protected by the photoresist layer. As a result, the silicon in the area protected by the photoresist remains after the etching process is completed. However, in another example, etching may also refer to a method that does not use photoresist but leaves at least a portion of the material after the etching process is completed.

The above explanation is used to distinguish between "etching" and "removing". When a material is "etched", at least a portion of the material is retained after the treatment is completed. In contrast, when "removing" a material, essentially all of the material is removed during the process. However, in some embodiments, "removing" is considered a broad term and may include etching.

The terms "substrate", "semiconductor wafer" or "wafer" described throughout this specification may refer to typical silicon substrate or silicon wafer. However, "substrate" or "wafer" may also refer to any semiconductor material, such as germanium, gallium arsenide, indium phosphide, and the like. In other embodiments, "substrate" or "wafer" may be non-conductive, such as a glass or sapphire wafer.

The "wafer surface" described throughout this specification may refer to the surface of the wafer during the manufacturing process on which the semiconductor elements or semiconductor materials have been formed. However, "wafer surface" may refer to a wafer surface at any stage, such as a wafer that has completed all integrated circuit fabrication (including packaging).

The present invention discloses a method for improving the uniformity of the wafer surface evenness. In modern integrated circuit design, many advanced techniques have been applied to achieve nano-scale feature sizes, of which planarization technology plays a key role. The planarization process is a step that is followed by the formation of each successive layer during the fabrication of the multilayer ICs. The planarization process ensures that the surface of the wafer is flat so that the desired IC wafer can be precisely fabricated with high yield.

Please refer to FIG. 1 to FIG. 5, which illustrate a method for improving the uniformity of a wafer surface evenness according to an embodiment of the present invention. First, as shown in FIG. 1, a wafer 10 is provided having at least a first region 101 and a second region 102. The first region 101 and the second region 102 have different pattern densities.

According to an embodiment of the present invention, the wafer 10 may include a silicon substrate (not shown) on which circuit elements such as transistors or memory elements are formed. These circuit elements are not shown for the sake of simplicity.

According to an embodiment of the invention, a plurality of gaps 110 may be formed in the first region 101 and a plurality of gaps 112 may be formed in the second region 102. For example, the first region 101 may be a high density DRAM array region and the second region 102 may be a peripheral circuit region. The gaps 110 may be storage node contact holes.

Next, a conductive layer 120 is deposited on the wafer 10. According to an embodiment of the present invention, the conductive layer 120 may include tungsten, but not limited thereto. According to an embodiment of the present invention, the conductive layer 120 may be formed by using a chemical vapor deposition (CVD) process or may be formed by using a physical vapor deposition (PVD) process.

For example, a first conductive layer 120a, such as a CVD tungsten metal layer, may be formed by a CVD process and filled into the gaps 110 and 112. A second conductive layer 120b, such as a PVD tungsten metal layer, may be deposited by a PVD process. The resistance of the second conductive layer 120b is smaller than the resistance of the first conductive layer 120a.

According to an embodiment of the present invention, since the first region 101 and the second region 102 have different pattern densities, the surface of the conductive layer 120 includes the recess structures 121 and 122 in the first region 101 and the second region 102, respectively. According to an embodiment of the present invention, the thickness of the conductive layer 120 may be approximately between 550 angstroms and 600 angstroms, but not limited thereto.

As shown in FIG. 2, a buffer layer 130 is formed on the conductive layer 120. According to an embodiment of the present invention, the buffer layer 130 may be a titanium nitride layer. According to an embodiment of the present invention, the buffer layer 130 may be formed by a chemical vapor deposition (CVD) process or may be formed by physical vapor deposition (PVD) process.

According to an embodiment of the present invention, the thickness of the buffer layer 130 may be approximately between 200 angstroms and 300 angstroms, but not limited thereto.

As shown in FIG. 3, a polishing process, for example, a chemical mechanical polishing (CMP) process is performed on the buffer layer 130. According to an embodiment of the present invention, the above polishing process has a higher polishing rate for the buffer layer 130 and a lower polishing rate for the conductive layer 120. The polishing process can continue until the surface of the conductive layer 120 is exposed. In other words, the conductive layer 120 serves as a polishing stop layer in the CMP process.

According to an embodiment of the present invention, in the polishing process, the selectivity of the conductive layer 120 to the buffer layer 130 may be at least 30, so that the polishing can stop on the surface of the conductive layer 120 without significantly abrading the conductive layer 120. The remaining buffer layer 130a fills in the recess structure 121, while the remaining buffer layer 130b fills in the recess structure 122, thereby forming a highly flat surface.

As shown in FIG. 4, an etching process is then performed to etch away part of the conductive layer 120 and the remaining buffer layers 130a and 130b. According to an embodiment of the present invention, the above etching process has substantially the same etching rate for the conductive layer 120 and the remaining buffer layers 130a and 130b. After the above etching process, the remaining conductive layer 120 has a relatively uniform thickness, and has a high surface evenness.

As shown in FIG. 5, a patterning process, for example, a photolithography process and an etching process are performed to pattern the conductive layer 120. For example, contact pad patterns 220 are formed in the first region 101, and wiring patterns 230 are formed in the second region 102.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for improving wafer surface uniformity, comprising:
   providing a wafer having a first region and a second region thereon, wherein the first region and the second region have different pattern densities;
   forming a conductive layer on the wafer, wherein said forming a conductive layer on the wafer comprises: depositing a first conductive layer on the wafer; and depositing a second conductive layer on the first conductive layer, wherein a resistance of the second conductive layer is smaller than that of the first conductive layer;
   forming a buffer layer on the conductive layer;
   performing a polishing process to polish the buffer layer until the conductive layer is exposed; and
   performing an etching process to etch away part of the conductive layer and remaining said buffer layer.

2. The method according to claim 1, wherein the buffer layer comprises titanium nitride.

3. The method according to claim 2, wherein the conductive layer comprises tungsten.

4. The method according to claim 3, wherein the etching process has same etching rate for the conductive layer and remaining said buffer layer.

5. The method according to claim 1, wherein polishing process is a chemical mechanical polishing process.

6. The method according to claim 5, wherein the conductive layer acts as a polish stop layer during the chemical mechanical polishing process.

7. The method according to claim 1, wherein the first conductive layer is a CVD tungsten metal layer and the second conductive layer is a PVD tungsten metal layer.

8. The method according to claim 1, wherein after the etching process, the method further comprises:
   patterning the conductive layer to form contact pad patterns in the first region.

* * * * *